United States Patent [19]

Smith et al.

[11] Patent Number: 5,911,887

[45] Date of Patent: Jun. 15, 1999

[54] METHOD OF ETCHING A BOND PAD

[75] Inventors: Mark Smith, Inner Grove Heights, Minn.; Edward Shamble, Milpitas; Walter Branco, San Jose, both of Calif.

[73] Assignee: Cypress Semiconductor Corporation, San Jose, Calif.

[21] Appl. No.: 08/683,407

[22] Filed: Jul. 19, 1996

[51] Int. Cl.⁶ ....................................................... B44C 1/22
[52] U.S. Cl. ................................ 216/72; 216/67; 216/77; 438/612; 438/634; 438/636; 438/637
[58] Field of Search ................................ 216/67, 72, 77; 438/612, 634, 636, 637

[56] References Cited

U.S. PATENT DOCUMENTS

| | | | |
|---|---|---|---|
| 4,267,012 | 5/1981 | Pierce et al. | 438/648 |
| 4,283,249 | 8/1981 | Ephrath | 216/79 |
| 4,678,539 | 7/1987 | Tomita et al. | 216/79 |
| 4,711,701 | 12/1987 | McLevige | 438/183 |
| 4,892,835 | 1/1990 | Rabinzohn et al. | 438/184 |
| 5,065,208 | 11/1991 | Shah et al. | 357/34 |
| 5,166,771 | 11/1992 | Godinho et al. | 257/368 |
| 5,188,704 | 2/1993 | Babie et al. | 216/79 |
| 5,201,994 | 4/1993 | Nonaka et al. | 216/79 |
| 5,219,784 | 6/1993 | Solheim | 437/57 |
| 5,225,040 | 7/1993 | Rohner | 216/67 |
| 5,240,555 | 8/1993 | Kilburn | 216/67 |
| 5,258,096 | 11/1993 | Sandhu et al. | 437/47 |
| 5,385,634 | 1/1995 | Butler et al. | 216/67 |
| 5,410,799 | 5/1995 | Thomas | 29/622 |
| 5,429,070 | 7/1995 | Campbell et al. | 118/723 R |
| 5,431,778 | 7/1995 | Dahm et al. | 156/662.1 |
| 5,661,083 | 8/1997 | Chen et al. | 438/637 |
| 5,688,703 | 11/1997 | Klingbeil, Jr. et al. | 437/41 |
| 5,780,323 | 7/1998 | Forouhi et al. | 438/131 |

FOREIGN PATENT DOCUMENTS

| | | |
|---|---|---|
| 0 242 893 | 10/1987 | European Pat. Off. . |
| 0 303 061 | 2/1989 | European Pat. Off. . |

OTHER PUBLICATIONS

IEDM 95, pp. 907–910, 1995, K.P. Lee, et al., "A Process Technology for 1 Giga–Bit DRAM".

*Primary Examiner*—Maria Nuzzolillo
*Assistant Examiner*—Laura Weiner
*Attorney, Agent, or Firm*—Oblon, Spivak, McClelland, Maier & Neustadt, P.C.

[57] ABSTRACT

This invention relates to a method of etching a bond pad in a semiconductor or integrated circuit, a method of using an etching apparatus and a semiconductor device.

17 Claims, No Drawings

METHOD OF ETCHING A BOND PAD

BACKGROUND OF THE INVENTION

1. Field of the Invention

This invention relates to a method of etching a bond pad, a method of using an etching apparatus and a semiconductor device.

2. Discussion of the Background

During the semiconductor manufacturing process, one of the latter steps in fabrication is the formation of bonding pads, which are used to connect an integrated circuit to a device. The bonding pads serve as a connection point for conductive wires.

In order to form bonding pads, a conductive material layer is formed to desired areas of an integrated circuit, which themselves form the site of attachment to wires.

Bonding pads are typically formed by successively depositing a patterned conductive material, a dielectric material and a passivation layer, followed by patterned etching of the passivation and dielectric layers, providing an exposed surface of the conductive material.

During the etching process, it has now been discovered that overetching of the passivation and dielectric layers can result in some etching of the underlying conductive material. In some cases, etching of the conductive material produces a non-volatile material, which can be dispersed throughout the etching chamber. The production of significant amounts of non-volatile etch by-products can pose problems in that the non-volatile materials can contaminate a semiconductor wafer, and therefore, must be periodically removed from the chamber. This is a particularly significant problem when the same etching chamber is used to conduct different etching processes. More specifically, non-volatile etching by-products of a conductive material layer can serve as a contaminant in subsequent etching steps.

Accordingly, a selective etching technique that reduces the production of non-volatile by-products of the conductive material is desired.

SUMMARY OF THE INVENTION

Accordingly, one embodiment of the present invention is to provide a selective method for etching dielectric and/or passivation materials that may be employed in a process for making bond pads in a semiconductor device or integrated circuit.

Another embodiment of the present invention is directed to a two-step etching process for forming a bond pad, comprising etching passivation and dielectric material layers overlying an anti-reflective material-coated conductive material, followed by etching the anti-reflective coating to expose the conductive material layer.

DETAILED DESCRIPTION OF THE PREFERRED EMBODIMENTS

The substrate to be etched according to the present process is typically a substrate comprising successive layers of a conducting material, an anti-reflective layer, a dielectric and/or a passivation layer.

Examples of conductive layer materials include metals such as aluminum, doped polysilicon, titanium, zirconium, hafnium, chromium, molybdenum, tungsten, copper, silver, gold, platinum, combinations thereof and conductive alloys thereof such as titanium-tungsten alloy, etc., more preferably aluminum. When the conductive material layer is aluminum, the aluminum may be alloyed, with silicon, especially when the aluminum conductive material layer is in contact with silicon. In such cases, the aluminum may be deposited onto a silicon surface and alloyed in accordance with conventional techniques.

The thickness of the conductive material layer is not particularly limited and is preferably about 1 to 2 $\mu$m thick, preferably about 1.5 $\mu$m.

The conductive material layer may be conductively connected to a region of a semiconductor device either directly, or through a conductive via or local interconnect. Non-limiting examples of a region to which a conductive material is connected include a source or a drain region of a substrate, a gate material of a gate electrode, a metallization layer or a local interconnect.

Examples of dielectric materials include conventional oxides, nitrides, oxynitrides, and other dielectrics, such as borophosphosilicate glass (BPSG), borosilicate glass (ESG), phosphosilicate glass, spin-on glass (SOG), silicon oxide, P-doped silicon oxide (P-glass), silicon nitride ($Si_xN_y$), silicon dioxide, a conventional oxide/nitride/oxide, silicon oxynitride ($SiO_xN_y$), metal nitrides such as $Si_3N_4$, $V_2O_5$, tetraethylorthosilicate-based oxides and titanium oxide.

The thickness of dielectric layer is not particularly limited, but preferably is in the range of about 0.3–3 $\mu$m, more preferably 0.5–1 $\mu$m.

Examples of passivation materials are silicon dioxide, silicon nitride, a conventional oxide/nitride/oxide or $Si_xN_y$ passivation layer(s) as desired and/or necessary, comprising a dielectric material such as a silicate (silicon dioxide, tetraethylorthosilicate based oxides, etc., phosphosilicate (phosphate-silicate-glass), borophosphosilicate glass (borophosphate-silicate glass), borosilicate-glass, oxide-nitride-oxide glass, tantalum pentoxide, plasma etched silicon nitride, titanium oxide, silicon oxynitrides, etc.

The thickness of passivation layer is not particularly limited, but preferably is in the range of about 0.3–3 $\mu$m, more preferably 0.5–1 $\mu$m.

The dielectric layer and the passivation layer may be of the same or different materials and may be a single layer of material (e.g., a dielectric material that acts as a passivation layer). Preferably, the dielectric layer is an oxide such as silicon dioxide, and the passivation layer is a metal nitride, such as silicon nitride.

A dielectric layer and/or passivation layer may be deposited by conventional methods known to those of ordinary skill in the art, such as by spin-on methods, sintering (which may further include sol-gel oxide formation), atmospheric pressure Chemical Vapor Deposition (APCVD), low pressure Chemical Vapor Deposition (LPCVD), plasma-enhance Chemical Vapor Deposition (EPCVD), sputtering or thermally grown, etc. A glass layer deposited by a chemical vapor deposition technique may be subject to a glass reflow step (e.g., by heating) to smooth, densify and further improve the contact between the protection layer and the substrate.

An anti-reflective cap or coating layer is typically disposed between a conductive material layer and dielectric and/or passivation layer(s). A layer is anti-reflective if the reflectivity is lower than that of the underlying conductive material layer. An anti-reflective coating offers advantages when a photolithographic step is to be performed, since the reduced reflectivity of the anti-reflective layer offers improved photolithographic resolution as compared to when no anti-reflective layer is used.

Examples of anti-reflective cap or coating layers include aluminum, silicon, titanium, zirconium, hafnium, chromium, molybdenum, tungsten, copper, silver, gold, platinum, combinations thereof, conductive alloys thereof such as titanium-tungsten alloy, CVD silicon and polymers such as polyamides. The anti-reflective coating is preferably a titanium tungsten alloy. The anti-reflective coating may inhibit or prevent migration of ions into the conductive material layer. In addition the anti-reflective layer may function (and preferably does function) as an etch stop layer during the dielectric material etch.

The thickness of the anti-reflective layer is not particularly limited and generally ranges from 50–2,500 Å, preferably 70–2,000 Å, more preferably 100–1,500 Å.

In addition, it is possible to include an etch stop layer disposed on the surface of the conductive material layer, either with or without an anti-reflective layer. Examples of etch stop layers include aluminum, silicon, titanium, zirconium, hafnium, chromium, molybdenum, tungsten, copper, silver, gold, platinum, combinations thereof, conductive alloys thereof such as titanium-tungsten alloy and CVD silicon. The etch stop layer is preferably a titanium tungsten alloy.

The thickness of the etch stop layer is not particularly limited and generally ranges from 50–2,500 Å, preferably 70–2,000 Å, more preferably 100–1,500 Å.

Accordingly, the present method may be practiced with either an anti-reflective layer, an etch stop layer or both deposited on the surface of a conductive material layer, provided that when both an anti-reflective layer and an etch stop layer are used, the etch stop layer is deposited on the surface of the conductive material layer.

Alternatively, a single layer may function as both a anti-reflective layer and an etch stop layer.

The conductive material layer, the anti-reflective layer and the etch stop layer may be deposited by conventional methods known to those of ordinary skill in the art. For example, vacuum deposition techniques may be used, such as chemical vapor deposition, sputtering and evaporation.

Etching of the bond pad may be conducted using conventional wet or dry etching techniques known to those of ordinary skill in the art. More specifically, etching may be conducted by plasma etching in a conventional plasma etching reactor, such as a planar reactor, a planar diode reactor, a triode reactive ion etcher, a hexode reactive ion etcher or a transformer coupled plasma reactor. An etch tunnel may be provided in the chamber to better direct the plasma, which may be generated by the method(s) disclosed in U.S. Pat. No. 5,441,596 (incorporated herein by reference). An example of a reactor is the DRYTEK 384T process chamber.

A non-limiting example of etching of the bond pad may be conducted as follows:

A resist material is deposited onto the dielectric and/or passivation layer of a layered structure having successive layers dielectric and/or passivation layer/anti-reflective coating and/or etch stop layer(s)/conductive material layer such as of $SiO_2$, TiW alloy and Al layers on an Si substrate patterned, leaving exposed the regions of the dielectric and/or passivation layer(s) to be etched. The exposed regions will be etched to form the bond pads. Examples of resist materials may be those conventionally known to those of ordinary skill in the art, including those conventionally used in the area of photolithography.

Negative resist materials may contain chemically inert polymer components such as rubber and/or photoreactive agents that react with light to form cross-links, e.g. with the rubber. When placed in an organic developer solvent, the unexposed and unpolymerized resist dissolves, leaving a polymeric pattern in the exposed regions. The preparation and deposition of negative resist materials is within the level of skill of one of ordinary skill in the art and can be performed without undue experimentation. Specific non-limiting examples of negative resist systems include cresol epoxy novolac-based negative resists, as well as negative resists containing one or more photoreactive polymers as described in Kirk-Othmer Encyclopedia of Chemical Technology, 3rd Edition, vol. 17, entitled "Photoreactive Polymers", pages 680–708, the relevant portions of which are hereby incorporated by references.

Positive resists have photoreactive components which are destroyed in the regions exposed to light. Typically the resist is removed in an aqueous alkaline solution, where the exposed region dissolves away. The preparation and deposition of positive resist materials is within the level of skill of one of ordinary skill in the art and can be performed without undue experimentation. Specific non-limiting examples of suitable positive resist systems include Shipley XP9402, JSR KRK-K2G and JSR KRF-L7 positive resists, as well as positive resists containing one or more photoreactive polymers as described in Kirk-Othmer Encyclopedia of Chemical Technology, 3rd Edition, vol. 17, entitled "Photoreactive Polymers", pages 680–708, the relevant portions of which are hereby incorporated by references.

Examples of resist materials are also described by Bayer et al, IBM Tech. Discl. Bull (USA) vol. 22, No. 5 October 1979 pp 1855; Tabei, U.S. Pat. No. 4,613,404; Taylor et al, J. Vac. Sci, Technol. B. Vol. 13, No. 6, 1995 pp 3078–3081; Argitis et al, J. Vac. Sci, Technol. B. Vol. 13, No. 6, 1995 pp 3030–3034; Itani et al, J. Vac. Sci, Technol. B. Vol. 13, No. 6, 1995 pp 3026–3029; Ohfuji et al, J. Vac. Sci, Technol. B. Vol. 13, No. 6, 1995 pp 3022–3025; Trichkov et al, J. Vac. Sci, Technol. B. Vol. 13, No. 6, 1995 pp 2986–2993Capodieci et al, J. Vac. Sci, Technol. B. Vol. 13, No. 6, 1995 pp 2963–2967; Zuniga et al, J. Vac. Sci, Technol. B. Vol. 13, No. 6, 1995 pp 2957–2962; Xiao et al, J. Vac. Sci, Technol. B. Vol. 13, No. 6, 1995 pp 2897–2903; Tan et al J. Vac. Sci, Technol. B. Vol. 13, No. 6, 1995 pp 2539–2544; and Mayone et al J. Vac. Sci, Technol. Vol. 12, No. 6, 1995 pp 1382–1382. The relevant portions of the above-identified references which describe the preparation and deposition of resist materials is hereby incorporated by reference.

Selection of a resist material for the particular etching conditions is within the level of skill of one of ordinary skill in the art and can be performed without undue experimentation.

Plasma etching may be conducted in two stages, wherein in the first stage, the dielectric material and/or passivation layers are removed without substantially etching the anti-reflective coating/etch stop layer(s). For example, when multiple layers of a nitride such as silicon nitride and an oxide such as silicon dioxide overlie an anti-reflective coating of titanium-tungsten alloy, etchants for reactive ion etching (RIE) of the dielectric material and/or passivation layers etch may include $SF_6$, $Cl_2$, $C_nH_xF_y$ (where $y \geq 1$, preferably $1 \leq y \leq 4$, and $x+y=2n+2$), HF, HCl and/or $CCl_4$, preferably $C_2F_6$ and/or $CHF_3$. The partial pressure ratio of $C_2F_6$ to $CHF_3$ in any mixture thereof may be from 0:100 to 90:10, respectively, preferably from 90:10 to 20:80, and more preferably from about 80:20 to about 50:50.

Alternatively, the dielectric material and/or passivation layer(s) may be etched in a two-step process, the first step using a first etchant or etchant mixture, and the second step using a second, distinct etchant or etchant mixture. In this embodiment, the first etchant may be an approximately 1:1 mixture of $CHF_3$ and $C_2F_6$ by pressure, and the second etchant may be an approximately 4:1 mixture of $CHF_3:C_2F_6$.

An inert gas (e.g., Ne, Kr, Xe, CO, $CO_2$, $SO_2$, He, Ar, $N_2$, mixtures thereof) may also be present during etching.

Selection of reaction condition such as Rf power, pressure and bias will vary depending of the reactor used and the etchant species, the selection of such parameters being within the level of ordinary skill to the artisan.

Examples of RIE conditions may include an Rf power of from 500–800 watts, preferably 600–700 watts; a total pressure of about 50–200 mTorr, preferably 60–150 mTorr, more preferably about 75–135 mtorr and even more preferably about 80–130 mTorr; and a bias of 600–1,600 volts, preferably 800–1,200 volts and more preferably 1,000–about 1,100 volts. Examples of diode plasma etching may include a voltage of about 100 volts and a pressure of from 1–10 torr.

Such etching conditions when used in combination with a "high-selectivity" mixture of $C_2F_6$ and $CHF_3$ may produce an etching selectivity of dielectric material and/or passivation layer(s) to anti-reflective coating/etch stop layer(s) of preferably $\geq 5:1$, more preferably $\geq 10:1$, even more preferably $\geq 20:1$, and most preferably $\geq 30:1$.

It is preferably for etching of the dielectric material and/or passivation layer(s) to be conducted under conditions which do not result in substantial etching of the conductive material layer. It is more preferably for etching of the dielectric material and/or passivation layer(s) to be conducted under conditions which leaves the anti-reflective coating/etch stop layer(s) substantially unetched.

The anti-reflective coating/etch stop layer(s) is then removed using etching conditions which selectively etch the anti-reflective coating/etch stop layer(s) without substantially etching the underlying conductive material layer.

In addition, the anti-reflective coating/etch stop layer(s) may be etched under conditions where the by-product(s) of etching the anti-reflective coating/etch stop layer(s) is volatile (e.g., a metal fluoride, a metal chloride [e.g., $SiCl_4$], etc.).

In addition, the anti-reflective coating/etch stop layer(s) may be etched under conditions where the by-product(s) of etching the conductive material layer is volatile (e.g., a metal fluoride, a metal chloride [e.g., $SiCl_4$], etc.).

For example, plasma etching under conditions without ion assistance are preferred so as to minimize ion etching. An example of plasma etching conditions are at a low bias of $\leq 200$ volts, preferably $\leq 150$ volts, more preferably $\leq 100$ volts.

For example, when an anti-reflective coating/etch stop layer of titanium-tungsten alloy overlies a layer of aluminum as a conductive material layer, the etchant species used to etch the anti-reflective coating/etch stop layer is preferably a chemical species which does not contain carbon, examples of which include $Cl_2$, HF, HCl, $SOF_2$, $SOF_4$, $SF_2$, $SO_2F_2$, $SF_4$, $PF_3$, $PF_5$, $POF_3$, $PCl_3$, $POCl_3$, $PCl_5$, $BF_3$, BrF, $AsF_3$, $AsF_5$, $HBF_4$, $SbF_5$, $XeF_x$ and $SF_6$, preferably $SF_6$. The use of an etchant species which does not contain carbon is preferred so as to avoid the generation of carbon polymers. However, the present method is not limited to the use of etchant species which do not contain carbon.

Anti-reflective coating/etch stop layer(s) etching is typically conducted at a low Rf power of 130–300 watts, preferably 140–160 watts, more preferably about 150 watts; at a pressure of about 120–180 mTorr, preferably 130–160 mTorr, more preferably about 150 mTorr; and at a low bias of about 50–200, preferably 80–140 volts, more preferably about 120 volts and even more preferably $\leq 100$ volts. The relative rates of etching (or "etching selectivity") of the anti-reflective coating/etch stop layer(s) to the conductive material during the anti-reflective coating/etch stop layer(s) etch step may be $\geq 5:1$, preferably $\geq 10:1$, more preferably $\geq 15:1$.

The present invention allows for selective etching of an anti-reflective coating/etch stop layer(s) and does not produce significant amounts of non-volatile materials. Accordingly, the present etching process allows for reduced contamination of semiconductor wafers processed in the etching chamber.

Another embodiment of the present invention is a method of using a plasma etching reactor in which bond pad etching and a subsequent and/or independent etching step are conducted in the same reactor, without an intermittent cleaning step (e.g. without cleaning one or more surfaces within the reactor after bond pad etching and before the second etching step). Within the context of the present invention, a cleaning step may involve removing powder residues from one or more surfaces in the interior of the etching chamber (e.g., a chamber wall, a wafer clamp or holder, etc.). Within the context of the present invention, cleaning may also comprise replacement of a portion of the apparatus such as a wafer clamp or holder or may simply comprise replacement of a dirty surface with a clean surface.

A semiconductor device on which subsequent etching is performed in the same chamber as was used to form bonding pads through a dielectric material and/or passivation layer to a conductive material layer, without an intermediate cleaning step, may be advantageously prepared with a low defect rate or defect density, as measured by the number of particles per unit area. A semiconductor device on which etching is performed in the same etching chamber as was previously used to form bonding pads, without an intermediate cleaning step, according to the present process may have a 0.25 $\mu$m particle defect density of $\leq 0.430/cm^2$, preferably $\leq 0.344/cm^2$, more preferably $\leq 0.258/cm^2$, even more preferably $\leq 0.172/cm^2$, even more preferably $\leq 0.086/cm^2$, even more preferably $\leq 0.043/cm^2$, and most preferably $\leq 0.021/cm^2$. A semiconductor device may have a 0.5 $\mu$m particle defect density of $\leq 0.258/cm^2$, more preferably $\leq 0.172/cm^2$, even more preferably $\leq 0.086/cm^2$, even more preferably $\leq 0.043/cm^2$, and most preferably $\leq 0.021/cm^2$. Particle density may also be an average for a given number of wafers.

The particle defect density may be measured by conventional techniques known to those of ordinary skill in the art such as by laser scattering or digital image processing (for example Pencor or KLA). Particle composition may be determined by X-ray analysis and scanning electron microscopy.

The composition of particles is not particularly limited and are typically particles of non-volatile materials resulting from an etching process. In particular particles of aluminum oxyfluoride and carbon containing particles are measured as particle defects.

The present invention also provides for a semiconductor device which comprises a bond pad, in which said bonding pad is formed by a process comprising the steps of 1) etching passivation and/or dielectric layers of a structure comprising sequentially (a) a conductive material layer, (b) an anti-reflective coating/etch stop layer(s) (c)

a dielectric material and/or a passivation layer with (d) a photoresist patterned thereon, without substantially etching said anti-reflective coating/etch stop layer(s); and 2) etching said anti-reflective coating/etch stop layer(s), to expose a surface of said conductive material layer.

A semiconductor device in which the bonding pads are formed by the above-described method are advantageously prepared with a low defect rate, as measured by a 0.25 $\mu$m particle defect density of $\leq 0.430/cm^2$, preferably $\leq 0.344/cm^2$, more preferably $\leq 0.258/cm^2$, even more preferably $\leq 0.172/cm^2$, even more preferably $\leq 0.086/cm^2$, even more preferably $\leq 0.043/cm^2$, and most preferably $\leq 0.021/cm^2$. A semiconductor device may have a 0.5 $\mu$m particle defect density of $\leq 0.258/cm^2$, more preferably $\leq 0.172/cm^2$, even more preferably $\leq 0.086/cm^2$, even more preferably $\leq 0.043/cm^2$, and most preferably $\leq 0.021/cm^2$.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters: Patent of the United States is:

1. A method of etching a bond pad in a structure comprising sequentially (a) a conductive material layer, (b) an etch stop layer, (c) a dielectric material layer, and (d) a patterned photoresist thereon comprising
    i) etching exposed portions of said dielectric material layer to expose portions of said etch stop layer without substantially etching said etch stop layer; and
    ii) etching exposed portions of said etch stop layer to expose a surface of said conductive material layer.

2. The method of claim 1, wherein said dielectric material layer is etched with an etchant comprising $C_nH_xF_y$, where $n \geq 1$ and $X+Y=2n+2$.

3. The method of claim 1, wherein said dielectric material layer is etched with an etchant comprising $CHF_3$ and $C_2F_6$.

4. The method of claim 1, wherein said etch stop layer is etched with an etchant consisting essentially of chemical species containing no carbon.

5. The method of claim 1, wherein said etch stop layer is etched with $SF_6$.

6. The method of claim 1, wherein said dielectric material layer is etched with a first etchant and then etched with a second etchant, wherein said second etchant is different than said first etchant.

7. The method of claim 1, wherein said conductive material layer is aluminum and said etch stop layer is titanium-tungsten alloy.

8. The method of claim 1, wherein said dielectric material layer is etched at an Rf power of 500–800 watts.

9. The method of claim 1, wherein said dielectric material layer is etched at a pressure of 60–150 mTorr.

10. The method of claim 1, wherein said dielectric material layer is etched at a bias of 800–1,200 Volts.

11. The method of claim 1, wherein said etch stop later is etched at an RF power of 130–300 watts.

12. The method of claim 1, wherein said etch stop layer is etched at a pressure of 120–180 mTorr.

13. The method of claim 1, wherein said etch stop layer is etched at a bias of 50–200 volts.

14. The method of claim 1, wherein an etching selectivity of said dielectric material layer to said etch stop layer is $\geq 20:1$.

15. The method of claim 1, wherein etching selectivity of said etch stop layer to said conductive material layer is $\geq 5:1$.

16. The method of claim 1, wherein said dielectric material layer comprises a passivation layer adjacent to said patterned conductive material layer comprises aluminum; said etch stop layer comprises TiW alloy; said dielectric material layer comprises silicon dioxide; and said passivation layer comprises silicon nitride, and wherein
    said etching of said dielectric material layer comprises etching through a region of said passivation layer.

17. A method of using a reactive ion etching apparatus comprising:
    1) etching a structure comprising sequentially (a) a conductive material layer, (b) an etch stop layer, (c) a dielectric material layer, and (d) a patterned photoresist thereon on a first semiconductor substrate in the reactive ion etching apparatus to form a bonding pad on the first semiconductor substrate; and
    2) then, without cleaning the reactive ion etching apparatus, etching a layer on a second semiconductor substrate in the reactive ion etching apparatus.

* * * * *